US012658869B2

(12) United States Patent (10) Patent No.: US 12,658,869 B2
Kim et al. (45) Date of Patent: Jun. 16, 2026

(54) CONTINUOUS TIME OPERATION AMPLIFIER AND OPERATING METHOD

(71) Applicants: SAMSUNG ELECTRONICS CO., LTD., Suwon-si (KR); Korea Advanced Institute of Science and Technology, Daejeon (KR)

(72) Inventors: Seong Joong Kim, Suwon-si (KR); Seung Tak Ryu, Daejeon (KR); Kent Edrian Lozada, Daejeon (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 412 days.

(21) Appl. No.: 18/327,789

(22) Filed: Jun. 1, 2023

(65) Prior Publication Data

US 2024/0120895 A1 Apr. 11, 2024

(30) Foreign Application Priority Data

Oct. 11, 2022 (KR) ........................ 10-2022-0129781

(51) Int. Cl.
*H03F 3/45* (2006.01)
(52) U.S. Cl.
CPC .................... *H03F 3/45475* (2013.01); *H03F 2203/45512* (2013.01)
(58) Field of Classification Search
CPC ..................................... H03F 3/45; H03F 1/02
USPC .............................................. 330/258, 259, 9
See application file for complete search history.

(56) References Cited

U.S. PATENT DOCUMENTS

| | | | | |
|---|---|---|---|---|
| 5,955,922 A | * | 9/1999 | Nicollini | ............. H03F 3/45654 330/257 |
| 6,940,348 B2 | * | 9/2005 | Confalonieri | ....... H03F 3/45937 330/69 |
| 7,136,006 B2 | | 11/2006 | Koh et al. | |
| 8,692,200 B2 | * | 4/2014 | Tao | ........................... G01J 1/28 250/338.4 |

(Continued)

FOREIGN PATENT DOCUMENTS

| | | |
|---|---|---|
| CN | 114531159 A | 5/2022 |
| KR | 10-1865133 B1 | 6/2018 |

OTHER PUBLICATIONS

Castello et al. "A High-Performance Micropower Switched-Capacitor Filter" *IEEE Journal of Solid-State Circuits*, vol. 20 No. 6. Dec. 1985 (pp. 1122-1132).

(Continued)

*Primary Examiner* — Henry Choe
(74) *Attorney, Agent, or Firm* — NSIP Law

(57) ABSTRACT

A continuous time op-amp includes a differential op-amp configured to produce, and output through output lines, output signals amplified based on a difference between input signals inputted to the differential op-amp, and a common mode feedback (CMFB) circuit configured to feed a common mode voltage back to the op-amp through a feedback line in continuous time through a capacitive coupled path, wherein the CMFB circuit includes: feedback capacitors connected between the output lines and the feedback line; switched capacitors charged based on a common mode reference voltage; and switching elements configured to control a connection between the feedback capacitors and the switched capacitors.

17 Claims, 10 Drawing Sheets

(56)             References Cited

U.S. PATENT DOCUMENTS

| | | | | |
|---|---|---|---|---|
| 11,050,386 B2 * | 6/2021 | Wang | ................. | H03F 3/45179 |
| 2021/0344306 A1 | 11/2021 | Rothe et al. | | |
| 2024/0057920 A1 | 2/2024 | Koo et al. | | |

OTHER PUBLICATIONS

Ryu et al. "A 10-bit 50-MS/s pipelined ADC with opamp current reuse." *IEEE Journal of Solid-State Circuits*, vol. 42 No. 3. Mar. 2007 (pp. 475-485).

* cited by examiner

100

Start

Produce output signals amplified differentially based on difference between input signals through output lines of differential op-amp ~710

Feed back common mode voltage in continuous time through capacitive coupled path including feedback capacitors connected between output lines and feedback line of differential op-amp ~720

End

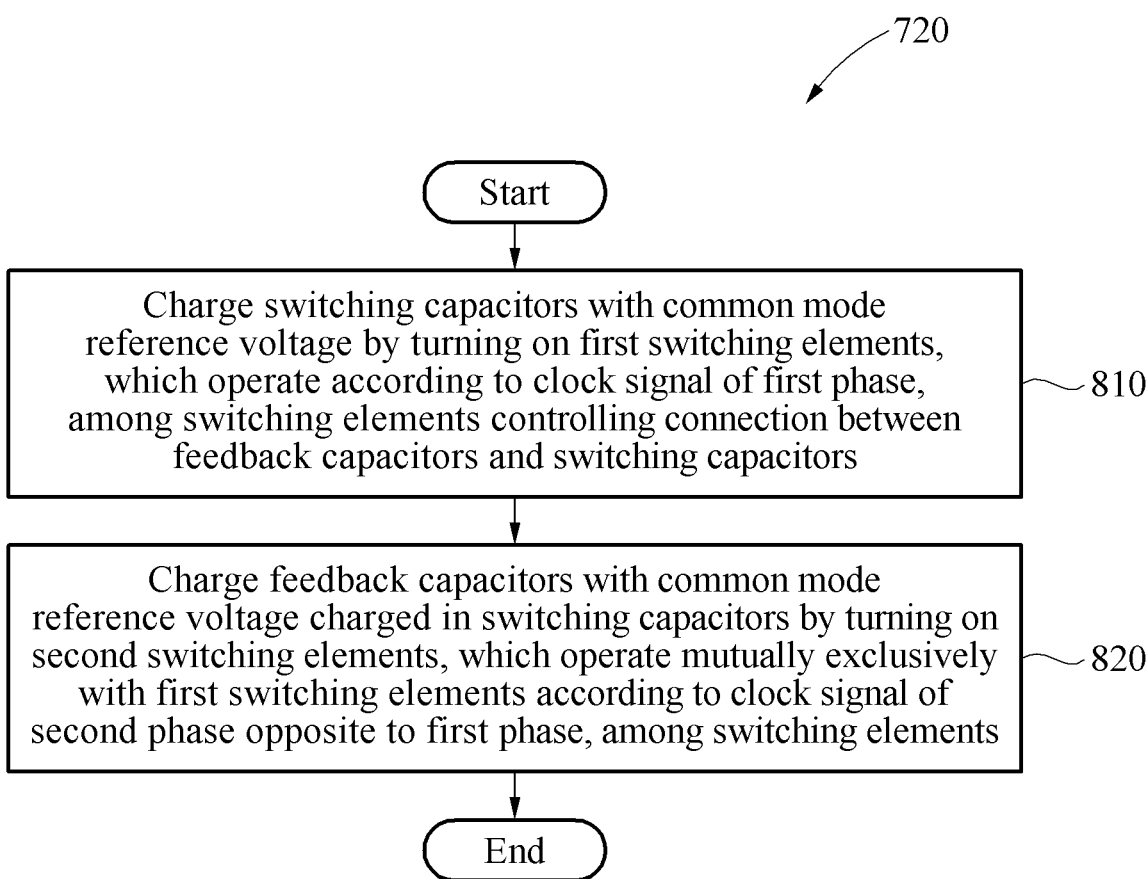

720

Start

Charge switching capacitors with common mode reference voltage by turning on first switching elements, which operate according to clock signal of first phase, among switching elements controlling connection between feedback capacitors and switching capacitors ~810

Charge feedback capacitors with common mode reference voltage charged in switching capacitors by turning on second switching elements, which operate mutually exclusively with first switching elements according to clock signal of second phase opposite to first phase, among switching elements ~820

End

FIG. 8

CONTINUOUS TIME OPERATION AMPLIFIER AND OPERATING METHOD

CROSS-REFERENCE TO RELATED APPLICATIONS

This application claims the benefit under 35 USC § 119(a) of Korean Patent Application No. 10-2022-0129781, filed on Oct. 11, 2022, in the Korean Intellectual Property Office, the entire disclosure of which is incorporated herein by reference for all purposes.

BACKGROUND

1 Field

The following description relates to a continuous time operation amplifier (op-amp) and an operating method thereof.

2. Description of Related Art

In general, an output common mode of a direct current (DC) level in an amplifier may be selected as a level by which a swing range and a gain of an output of the amplifier may be maximized. When a bias voltage of an amplifier providing a common mode is fixed, an output signal range may not be secured or a gain may decrease due to, for example, power, temperature, a change in process conditions, a difference between a common mode and an output common mode of an input of an amplifier, and/or a change in an output common mode due to noise.

To improve stability of an amplifier output, the amplifier may be configured with a feedback circuit added on a bias part of the amplifier. Such a circuit is often referred to as a common mode feedback (CMFB) circuit.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a continuous time op-amp includes: a differential op-amp configured to produce, and output through output lines, output signals amplified based on a difference between input signals inputted to the differential op-amp; and a common mode feedback (CMFB) circuit configured to feed a common mode voltage back to the op-amp through a feedback line in continuous time through a capacitive coupled path, wherein the CMFB circuit includes: feedback capacitors connected between the output lines and the feedback line; switched capacitors charged based on a common mode reference voltage; and switching elements configured to control a connection between the feedback capacitors and the switched capacitors.

The CMFB circuit may be configured to feed back the common mode voltage by periodically recharging, by the switching elements and the switched capacitors, a charge leakage of the feedback capacitors occurring in the capacitive coupled path.

The CMFB circuit may include a negative feedback loop configured to adjust a bias feedback voltage of the differential op-amp through the feedback line based on a comparison result of the common mode voltage and the common mode reference voltage.

The switching elements may be operated mutually exclusively, with respect to each other, based on a clock signal.

The switching elements may include first switching elements configured to operate according to a first phase of the clock signal and second switching elements configured to operate mutually exclusively with the first switching elements according to a second phase of the clock signal that is opposite in phase with respect to the first phase.

The first switching elements may be configured to be turned on according to the first phase to charge the switched capacitors with the common mode reference voltage.

The second switching elements may be configured to be turned on according to the second phase to charge the feedback capacitors with the common mode reference voltage charged in the switched capacitors.

The clock signal may include a chopping clock.

The differential op-amp may include a chopping amplifier configured to generate the chopping clock by modulating a direct current voltage input to the differential op-amp to an alternating voltage based on the clock signal.

The input signals may include respective mutually inverted input voltages.

The continuous time op-amp may further include a clock generator configured to generate a clock signal controlling opening and closing of the switching elements.

The differential op-amp may include an operation transconductance amplifier (OTA) configured to produce amplified current values following an application of mutually inverted input voltage values to the input signals.

In another general aspect, a method of operating a continuous time op-amp includes: producing output signals amplified based on a difference between input signals inputted to the continuous time op-amp, wherein the output signals are outputted through output lines of the continuous time op-amp; and feeding a common mode voltage in continuous time back to the continuous time op-amp through a capacitive coupled path that includes feedback capacitors connected between the output lines and a feedback line of a differential op-amp.

First and second switching elements may be configured to control a connection between the feedback capacitors and switched capacitors, and the feeding back of the common mode voltage may include: charging the switched capacitors with a common mode reference voltage by turning on the first switching elements with a first phase of a clock signal; and charging the feedback capacitors with the common mode reference voltage charged in the switched capacitors by turning on the second switching elements with a second phase of the clock signal, wherein the second phase is opposite to the first phase.

The feeding back of the common mode voltage may further include periodically recharging a charge leakage of the feedback capacitors occurring in the capacitive coupled path by the first and second switching elements and the switched capacitors.

The feeding back of the common mode voltage may include adjusting a bias feedback voltage of the differential op-amp through the feedback line based on comparing of the common mode voltage to the common mode reference voltage, wherein the adjusting causes the common mode voltage to become closer to the common mode reference voltage.

The input signals include a first input signal and a second input signal, and a first modulation signal may be generated by modulating the first input signal.

A noise component and an offset component may be added to the first modulation signal.

A modulation result may be obtained by applying an amplification result and a second clock signal to a modulator.

Other features and aspects will be apparent from the following detailed description, the drawings, and the claims.

BRIEF DESCRIPTION OF THE DRAWINGS

FIG. 8 illustrates an example of a method of feeding back a common mode voltage in continuous time, according to one or more embodiments.

Figure 1:
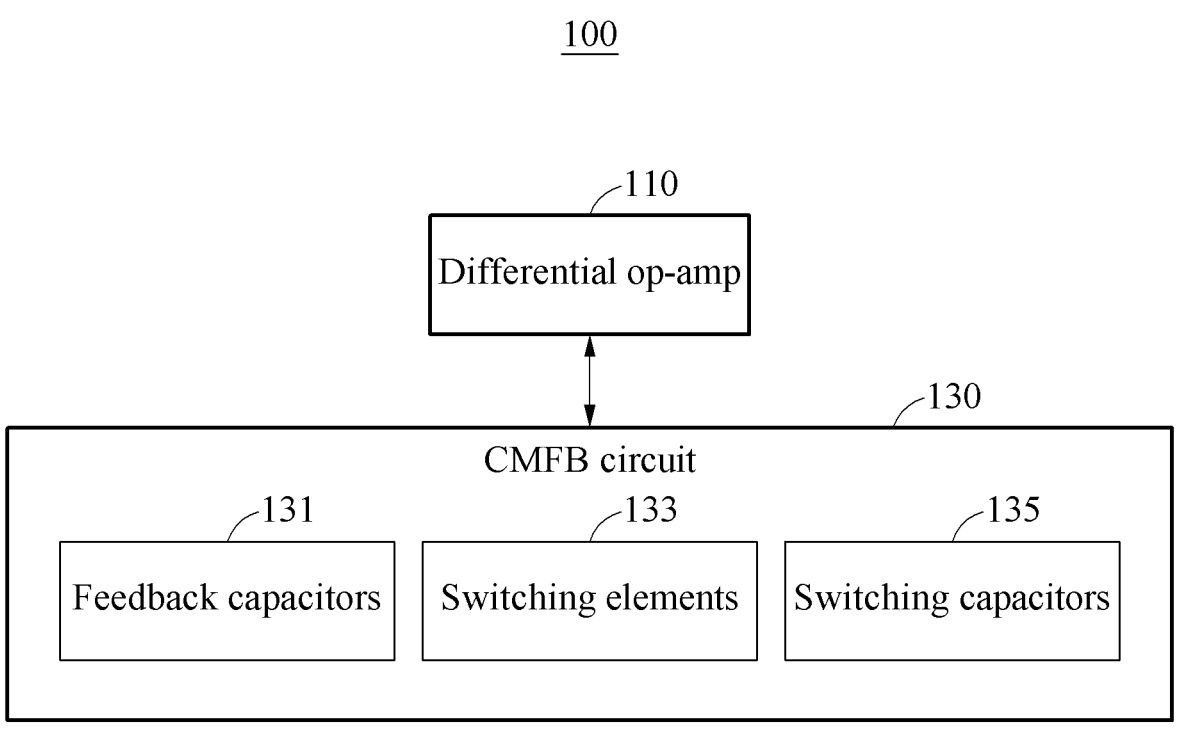
FIG. 1 illustrates an example of a continuous time op-amp, according to one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a," "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

FIG. 1 illustrates an example of a continuous time op-amp. A continuous time op-amp 100 may include a differential op-amp 110 and a common mode feedback (CMFB) circuit 130.

The differential op-amp 110 may produce output signals, output through output lines, which are amplified based on a difference between input signals. The input signals may include, for example, mutually inverted input voltages. The differential op-amp 110 may be, for example, a fully-differential op-amp. Hereinafter, a fully-differential op-amp may be represented by the differential op-amp 110.

The differential op-amp 110 may be, for example, a chopping amplifier which is described with reference to FIG. 5, or an operation transconductance amplifier (OTA), but is not limited thereto. An OTA may produce amplified currents following an application of mutually inverted input voltages to input signals.

The CMFB circuit 130 may feed a common mode voltage $V_{CM}$ in continuous time back through a capacitive coupled path (i.e., provide continuous feedback). Here, a capacitive coupled path may be a path passing through feedback capacitors 131 of which one end is connected to output lines (e.g., output lines 211 of FIG. 2B) of the differential op-amp 110 and another end is connected to a feedback line (e.g., a feedback line 213 of FIG. 2B) of the differential op-amp 110.

The CMFB circuit 130 may include, for example, the feedback capacitors 131, switching elements 133, and switched capacitors 135, but is not limited thereto. The CMFB circuit 130 may be, for example, a discrete time CMFB circuit, but is not limited thereto.

The feedback capacitors 131 may be connected between the output lines 211 of the differential op-amp 110 and the feedback line 213 of the differential op-amp 110. The feedback capacitors 131 may correspond to, for example, feedback capacitors $C_c$ 231 illustrated in FIG. 2B.

The switching elements 133 may control a connection between the feedback capacitors 131 and the switched capacitors 135. The switching elements 133 may be controlled mutually exclusively based on a clock signal ($C_{LK}$) A clock signal may be, for example, a chopping clock based on a chopping frequency Fc of a chopping amplifier. In this case, the differential op-amp 110 may be a chopping amplifier which modulates a direct current (DC) voltage input to the differential op-amp 110 to an alternating current (AC) voltage based on a clock signal.

Alternatively, the clock signal may be generated by a separate clock generator. In which case the continuous time op-amp 100 may further include a clock generator which generates the clock signal that controls the switching elements 133.

The switching elements 133 may include, for example, first switching elements (e.g., first switching elements 235 of FIG. 2B) operating according to a clock signal $C_{LK1}$ of a first phase and/or second switching elements (e.g., second switching elements 237 of FIG. 2B) operating mutually exclusively with the first switching elements according to a clock signal $C_{LK2}$ of a second phase that is opposite from the first phase. The first switching elements 135 may be turned on according to the clock signal $C_{LK1}$ of the first phase to enable charging the switched capacitors 135 with a common mode reference voltage $V_{CM\_REF}$. The second switching elements 237 may be turned on according to the clock signal $C_{LK2}$ of the second phase to enable charging the feedback capacitors 131 with a common mode reference voltage $V_{CM\_REF}$ charged in the switched capacitors 135.

The switched capacitors 135 are charged based on a common mode reference voltage $V_{CM\_REF}$. The switched capacitors 135 may correspond to, for example, switched capacitors $C_S$ 233 illustrated in FIG. 2B.

The CMFB circuit 130 may feed a common mode voltage back in continuous time by periodically recharging a charge leakage of the feedback capacitors 131; the leakage occurring in a capacitive coupled path of the switching elements 133 and the switched capacitors 135.

The CMFB circuit 130 may include a negative feedback loop adjusting a bias feedback voltage $V_{BIAS}$ of the differential op-amp 110 through a feedback line, where the adjusting is based on a result of a comparison between a common mode voltage $V_{CM}$ and a common mode reference voltage $V_{CM\_REF}$, and where the adjusting is performed so that the common mode voltage becomes close (or closer) to the common mode reference voltage $V_{CM\_REF}$.

A connection relationship between the differential op-amp 110 and the CMFB circuit 130 and a connection relationship between components of the CMFB circuit 130 are described with reference to FIGS. 2A and 2B.

Figure 2A:
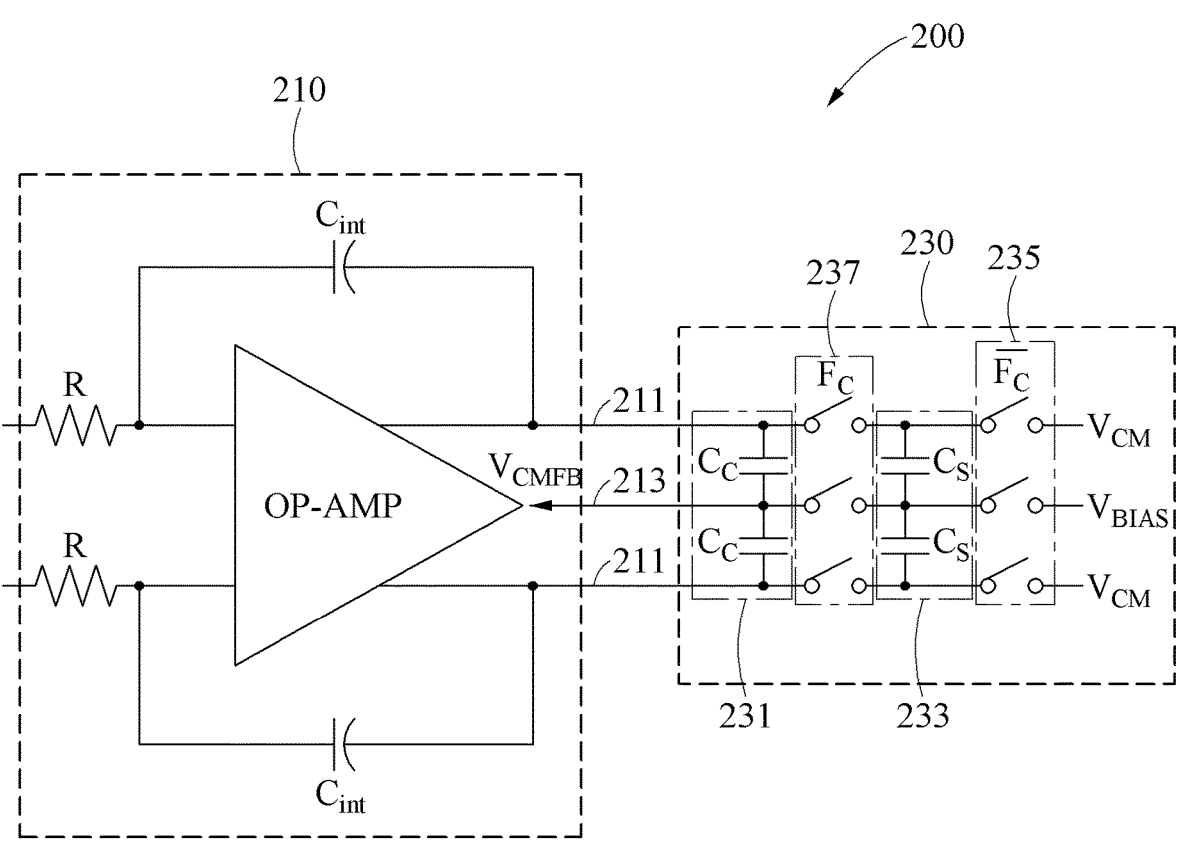
FIGS. 2A and 2B illustrate an example of a circuit diagram and an equivalent circuit of a continuous time op-amp, according to one or more embodiments.
Figure 2B:
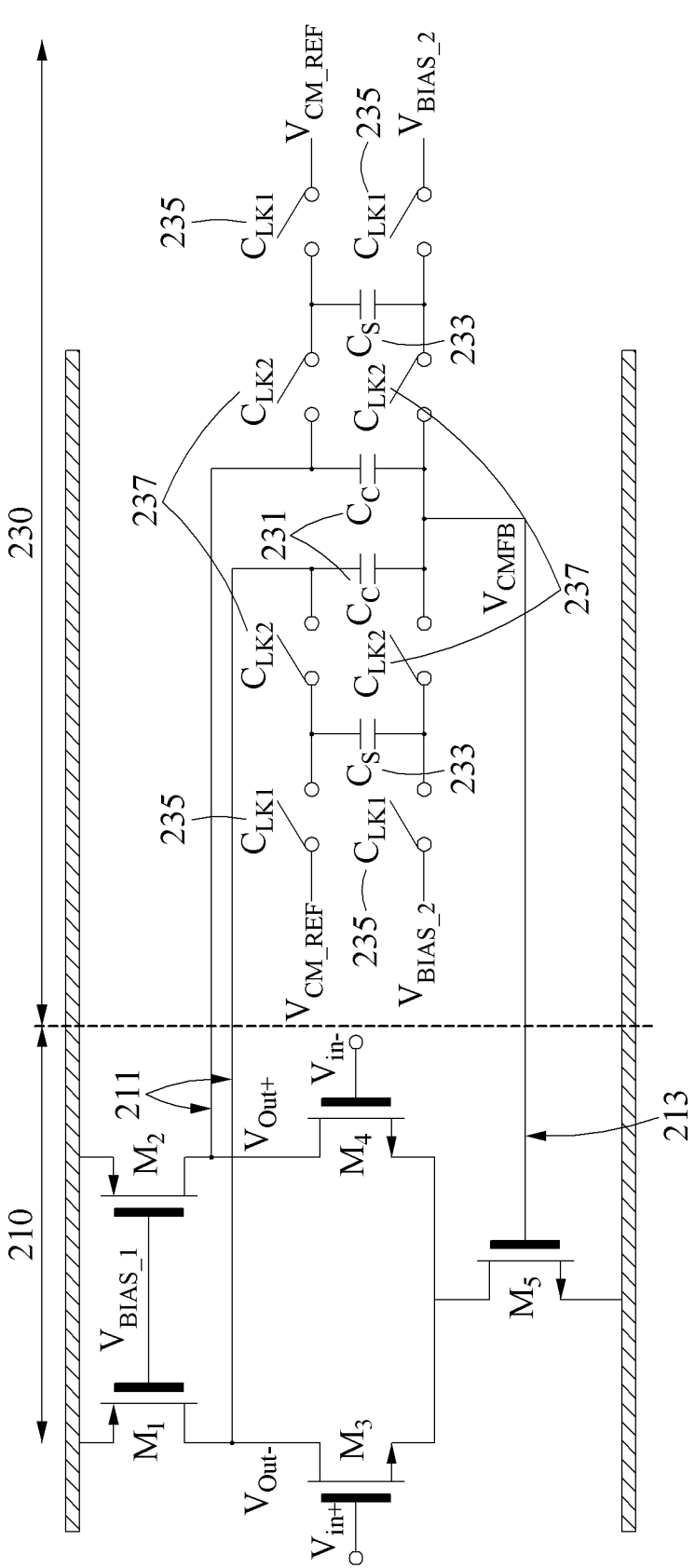

FIGS. 2A and 2B illustrate an example of a continuous time op-amp. Referring to FIGS. 2A and 2B, a circuit of a continuous time op-amp 200 including a CMFB circuit 230, which is implemented as a structure of a differential op-amp 210 and switched capacitors, is illustrated according to an example. The CMFB circuit 230 according to an example may be, for example, a switched-capacitor(SC)-CMFB circuit. Hereinafter, the CMFB circuit 230 denotes an SC-CMFB circuit even if there is no separate description or mention.

Fully-differential circuits are often used when implementing a high-performance analog integrated circuit in a mixed-signal environment. Compared to a single-ended counterpart, a fully-differential circuit may be better at blocking common mode noise and reducing supply fluctuation of high-frequency power. However, since a common mode loop gain from an external feedback loop near the differential op-amp 210 is small, it may be difficult to accurately define an output common mode voltage of the differential op-amp 210. Without proper control, an output common mode voltage of the differential op-amp 210 may, for example, drift to a supply rail due to a power supply fluctuation, a process fluctuation, an offset, etc.

The differential op-amp 210 according to an example may use a circuit including a common mode (CM) feedback loop, or in other words, the CMFB circuit 230, to prevent signal distortion caused by an output common mode voltage $V_{CM}$ formed near a ground voltage $V_{SS}$ or a power voltage $V_{DD}$. The CMFB circuit 230 may fix an output voltage (e.g., a common mode voltage $V_{CM}$ at, for example, $(V_{DD}+V_{SS})/2)$ by a negative feedback loop, to stabilize the output of the CMFB circuit 230.

Referring to both FIG. 2A and FIG. 2B, the differential op-amp 210 may include load transistors $M_1$ and $M_2$, input transistors $M_3$ and $M_4$, and resistors R. The input transistors $M_3$ and $M_4$ may be, for example, N-MOS transistors, and the load transistors $M_1$ and $M_2$ may be, for example, P-MOS transistors, but are not limited thereto.

Input signals $V_{in+}$ and $V_{in-}$ input to gates of the input transistors $M_3$ and $M_4$, respectively, of the differential op-amp 210 may be amplified to be produced through output voltages $V_{out+}$ and $V_{out-}$ to the output lines 211. The load transistors $M_1$ and $M_2$ may function as loads in the differential op-amp 210. A bias voltage $V_{BIAS,1}$ applied the gate terminals of the load transistors $M_1$ and $M_2$ may be, for example, a virtual ground voltage, but is not limited thereto.

The CMFB circuit 230 connected to the output lines 211 of the differential op-amp 210 may provide a common mode feedback loop to the differential op-amp 210 so that a common mode voltage of output terminals of the differential op-amp 210 are stabilized.

The CMFB circuit 230 may include, for example, the feedback capacitors $C_c$ 231, the switching elements 235 and 237, and the switched capacitors C s 233, but is not limited thereto.

The CMFB circuit 230 may, for example, compare a common mode voltage $V_{CMFB}$ produced through the feedback line 213 to the desired common mode reference voltage $V_{CM\_REF}$ to generate the bias voltage $V_{BIAS,1}$ which in turn controls a current source of the differential op-amp 210. In this case, the common mode voltage $V_{CMFB}$ output through the feedback line 213 may be identical to the common mode voltage $V_{CM}$.

Each of the feedback capacitors $C_c$ 231 in the CMFB circuit 230 according to an example may, for example, be pre-charged due to a voltage (e.g., a $V_{DD}$) having a polarity such as (+, −) and (−, +). Here, the feedback capacitors $C_c$ 231 may be, for example, floating capacitors.

An output common mode DC voltage of the differential op-amp 210 may be defined by (depend on) a voltage stored in the feedback capacitors $C_c$ 231. An output common mode DC voltage of the differential op-amp 210 may, for example, $V_{CM\_REF}$-$V_{BIAS\_2}$, charged to switched capacitors $C_s$ 233, and may be maintained through periodic charge sharing between the switched capacitors $C_s$ 233 and the feedback capacitors $C_c$ 231. Such an operation may correspond to a refresh state, which is described below.

Output voltages $V_{out-}$ and $V_{out+}$ of the differential op-amp 210 may, for example, be (i) level-shifted by a voltage $V_{DC}$ having a polarity, (ii) averaged by the feedback capacitors $C_c$ 231, and may then (iii) generate a desired bias voltage $V_{BIAS,2}$. The feedback capacitors $C_c$ 231 may be charged by the voltage $V_{DC}$ having a polarity and may be represented as a series voltage source having a voltage value $V_{DC}$ for a common mode.

The common mode voltage $V_{CM}$ may be, for example, $(V_{OP}+V_{ON})/2$.

A (i) sensing of the common mode voltage $V_{CM}$ corresponding to an output voltage of the common mode CM and a (ii) comparison between the common mode reference voltage $V_{CM\_REF}$ and the common mode voltage $V_{CM}$ may both be performed through a voltage difference between an output of the differential op-amp 210 and a voltage charged in the feedback capacitors $C_c$ 231 (which are connected between gate nodes of a transistor), which is a bias current source $M_5$. The common mode reference voltage $V_{CM\_REF}$ and the bias voltage $V_{BIAS,2}$ may be configured to generate an ideal voltage between the feedback capacitors $C_c$ 231, and the switched capacitors $C_s$ 233 may be charged with the ideal voltage to transfer the ideal voltage to the feedback capacitors $C_c$ 231 through charge sharing. An output voltage of the differential op-amp 210 may be determined by a configuration of a negative feedback circuit through the differential op-amp 210 and the feedback capacitors $C_c$ 231.

Sensing of the common mode voltage $V_{CM}$ and comparison between the common mode reference voltage $V_{CM\_REF}$ and the common mode voltage $V_{CM}$ may be directly performed by the feedback capacitors $C_s$ 233, which are precharged with a desired DC voltage. The desired DC voltage may be implemented by transmitting a difference between the common mode reference voltage $V_{CM\_REF}$, an ideal voltage of an output voltage $V_{out}$, and the bias voltage $V_{BIAS,2}$, an ideal voltage of the transistor, which is the bias current source $M_5$, to the feedback capacitors $C_s$ 233.

The CMFB circuit 230 may sense a common mode of extracting a DC level of an output of the differential op-amp 210. For example, when the output common mode voltage $V_{CM}$ of the differential op-amp 210 becomes greater or less than an arbitrary reference value (e.g., the common mode reference voltage $V_{CM\_REF}$), the CMFB circuit 230 may perform the aforementioned sensing by comparing the output common mode voltage $V_{CM}$ to the common mode reference voltage $V_{CM\_REF}$ (in a DC level of an output of the differential op-amp 210), and may then adjust the bias feedback voltage $V_{BIAS}$ so that the output common mode voltage $V_{CM}$ becomes close to the common mode reference voltage $V_{CM\_REF}$ through a negative feedback loop.

For example, when the output common mode voltage $V_{CM}$ of the differential op-amp 210 becomes greater than the common mode reference voltage $V_{CM\_REF}$, the CMFB circuit 230 may increase the common mode voltage $V_{CMFB}$ (which is fed back through a feedback line of the CMFB circuit 230 by the transistor, and which is the bias current source $M_5$) until a difference between the output common mode voltage $V_{CM}$ and the common mode reference voltage $V_{CM\_REF}$ is stabilized within a resolution of the CMFB circuit 230. The CMFB circuit 230 may thus maintain a constant level/amplitude of the output common mode voltage $V_{CM}$. The differential op-amp 210 may adjust a common mode voltage of the differential op-amp 210 by adjusting a size of a feedback voltage (which may be adjusted by the transistor), which is the bias current source $M_5$. The transistor, which is the bias current source $M_5$, may be, for example, an N-MOS transistor, but is not limited thereto.

The CMFB circuit 230 according to an example may use charge redistribution provided by a switched capacitor to perform a common mode feedback function without requiring additional power consumption.

The CMFB circuit 230 may feed the common mode voltage $V_{CM}$ in continuous time back through a capacitive coupled path. A "capacitive coupled path" is a path passing through the feedback capacitors Cc 231 of which one end is connected to the output lines 211 of the differential op-amp 210 and another end is connected to the feedback line 213 of the differential op-amp 210.

An operation of the CMFB circuit 230 may be divided into a charge hold phase, in which a target electric charge (to be compared with an electric charge of the feedback capacitors Cc 231) is determined, and a charge refresh state, in which the target electric charge is compared with the electric charge of the feedback capacitors Cc 231 to update the common mode voltage $V_{CMFB}$ produced through a feedback line.

Nodes of the CMFB circuit 230 corresponding to output lines of the differential op-amp 210 are in an opposite phase from the differential op-amp 210 and may form a negative feedback loop through the feedback capacitors Cc 231 of the CMFB circuit 230. A negative feedback loop may be formed in such a way that an output common mode is balanced with the feedback line 213 for one period, to suppress changes in the output common mode. As a result, a variable element, which distorts a DC level in the continuous time op-amp 200, may be compensated-for with a change in an amount of electric charge stored in the feedback capacitors Cc 231.

The switched capacitors $C_S$ 233 may supply an initial target electric charge to the feedback capacitors Cc 231 so that balancing of a common mode and a feedback line is not performed while an initial electric charge of the feedback capacitors Cc 231 is set as an unknown value. In addition, the switched capacitors $C_S$ 233 may periodically supplement a charge loss of the feedback capacitors Cc 231 so that a common mode is not distorted again by a discharge of the feedback capacitors Cc 231 after each node is stabilized.

Capacitors (e.g., the feedback capacitors Cc 231 and the switched capacitors $C_S$ 233) in the CMFB circuit 230 may generate a common mode voltage in the CMFB circuit 230. In addition, the switching elements 235 and 237 may refresh the CMFB circuit 230.

The feedback capacitors Cc 231 may be connected in series to each output end of the differential op-amp 210, that is, to the output lines 211 of the differential op-amp 210. The feedback capacitors Cc 231 may be connected between the output lines 211 of the differential op-amp 210 and the feedback line 213 of the differential op-amp 210.

The switched capacitors Cs 233 may be charged based on a common mode reference voltage $V_{CM\_REF}$ and be switchably connected in parallel with the feedback capacitors Cc 231, respectively, by switching elements (e.g., the first switching elements 235 and the second switching elements 237).

The switching elements 235 and 237 may control a connection between the feedback capacitors Cc 231 and the switched capacitors C s 233. The switching elements 235 and 237 may be controlled mutually exclusively based on a clock signal (when one is open, the other is closed, and vise-versa). The first switching elements 235 may operate according to a clock signal of a first phase, and the second switching elements 237 may operate mutually exclusively with the first switching elements 235 according to a clock signal of a second phase, which is opposite from the first phase. Therefore, the first switching elements 235 and the second switching elements 237 are not both turned on or both turned off at the same time.

The first switching elements 235 may include, for example, a 1-1 switching element controlling a connection between the common mode reference voltage $V_{CM\_REF}$ and the switched capacitors $C_S$ 233 and a 1-2 switching element controlling a connection between the bias voltage $V_{BIAS,2}$ and the switched capacitors $C_S$ 233. The first switching elements 235 are turned on by the clock signal $C_{LK1}$ of the first phase to charge (apply) the common mode reference voltage $V_{CM\_REF}$ (more specifically a differential voltage between the common mode reference voltage $V_{CM\_REF}$ and the bias voltage $V_{BIAS,2}$) to the switched capacitors $C_S$ 233.

An electric charge charged in the switched capacitors $C_S$ 233 by the first switching elements 235 may be transmitted to the feedback capacitors Cc 231 by the second switching elements 237, which are turned on according to the clock signal $C_{LK2}$ of the second phase (which is a phase opposite from the first phase). The second switching elements 237 may, for example, control a connection between the switched capacitors $C_S$ 233 and the feedback capacitors Cc 231. A parallel connection between the switched capacitors $C_S$ 233 and the feedback capacitors Cc 231 may be formed as the second switching elements 237 are turned on according to the clock signal $C_{LK2}$ of the second phase. Through the parallel connection, a voltage (e.g., the common mode reference voltage $V_{CM\_REF}$ or a differential voltage between the common mode reference voltage $V_{CM\_REF}$ and the bias voltage $V_{BIAS,2}$) charged in the switched capacitors $C_S$ 233 may be charged to the feedback capacitors Cc 231.

The CMFB circuit 230 may periodically recharge a charge leakage of the feedback capacitors Cc 231 caused by the transistor, which is the bias current source $M_5$ included in a capacitive coupled path, by the switching elements 235 and 237 and the switched capacitors $C_S$ 233, to thereby feed back a common mode voltage in continuous time.

In an example, the CMFB circuit 230 may feed back the common mode voltage $V_{CM}$ in continuous time through a capacitive coupled path, performing amplification without an additional amplifier, and may thus save analog power.

In addition, for example, a same chopping clock as a chopping clock used to reduce flicker noise of the differential op-amp 210 may be used as a clock of the first phase and the second phase, without generating a separate clock.

Figure 3:
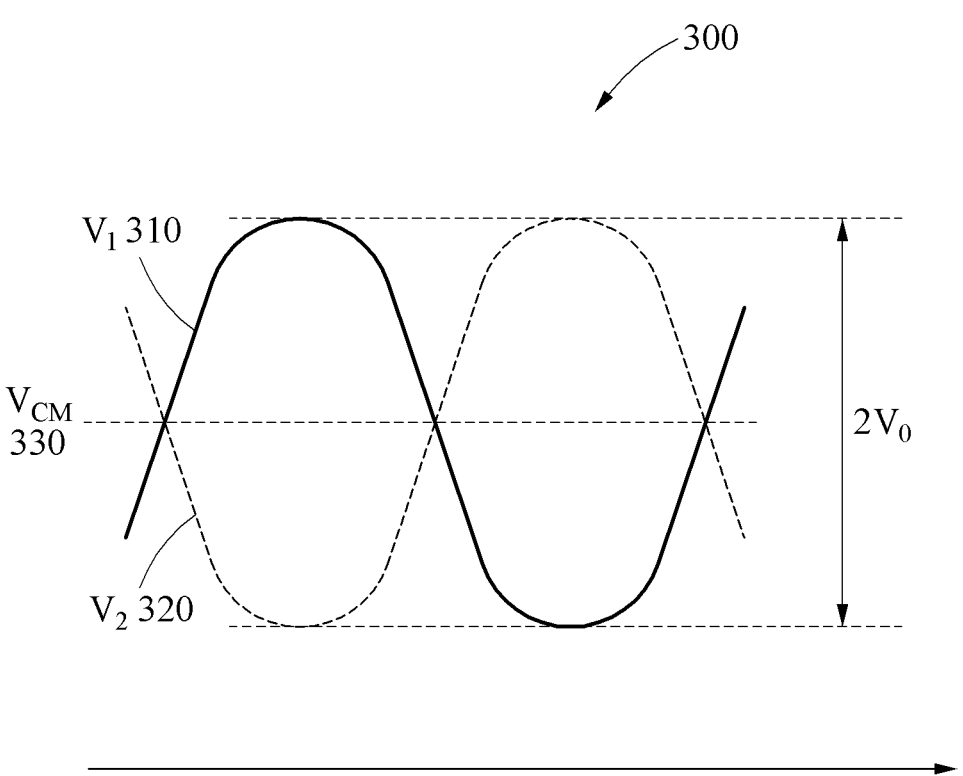
FIG. 3 illustrates an example of a relationship between input signals input to a differential op-amp, according to one or more embodiments.

FIG. 3 illustrates an example of a relationship between input signals input to a differential op-amp. Referring to FIG. 3, a relationship between two input signals $V_1$ 310 and $V_2$ 320 input to a differential op-amp (e.g., the differential op-amp 210 of FIG. 2) and a common mode level $V_{CM}$ 330 according to an example is illustrated as indicated by reference number 300. The $V_1$ 310 may correspond to, for example, Vin+, and the $V_2$ 320 may correspond to Vin−.

One input signal among the two identical input signals may be inverted so that signal components amplified from an output of a differential op-amp do not offset each other. Accordingly, input signals of the differential op-amp may be $V_1$ 310 and $V_2$ 320. Since a differential op-amp produces an amplification result proportional to a difference between two input signals and one of the two input signals has an inverted value, the output of the differential op-amp may be a result of adding identical input signals.

Output signals of a differential op-amp may have an identical size and have swings in opposite directions, so a difference between the output signals is twice in terms of amplitude, and may have an identical average level $V_{CM}$. For example, the differential op-amp may produce a signal $2A \times V_{in}$ which is amplified by 2A folds (A corresponds to a gain of the differential op-amp) from input signals $V_{in}$.

Here, "identical average level" means a DC output voltage generated from a bias result of a transistor. An average level may be called a "common mode level" or an "output common mode voltage".

Figure 4A:
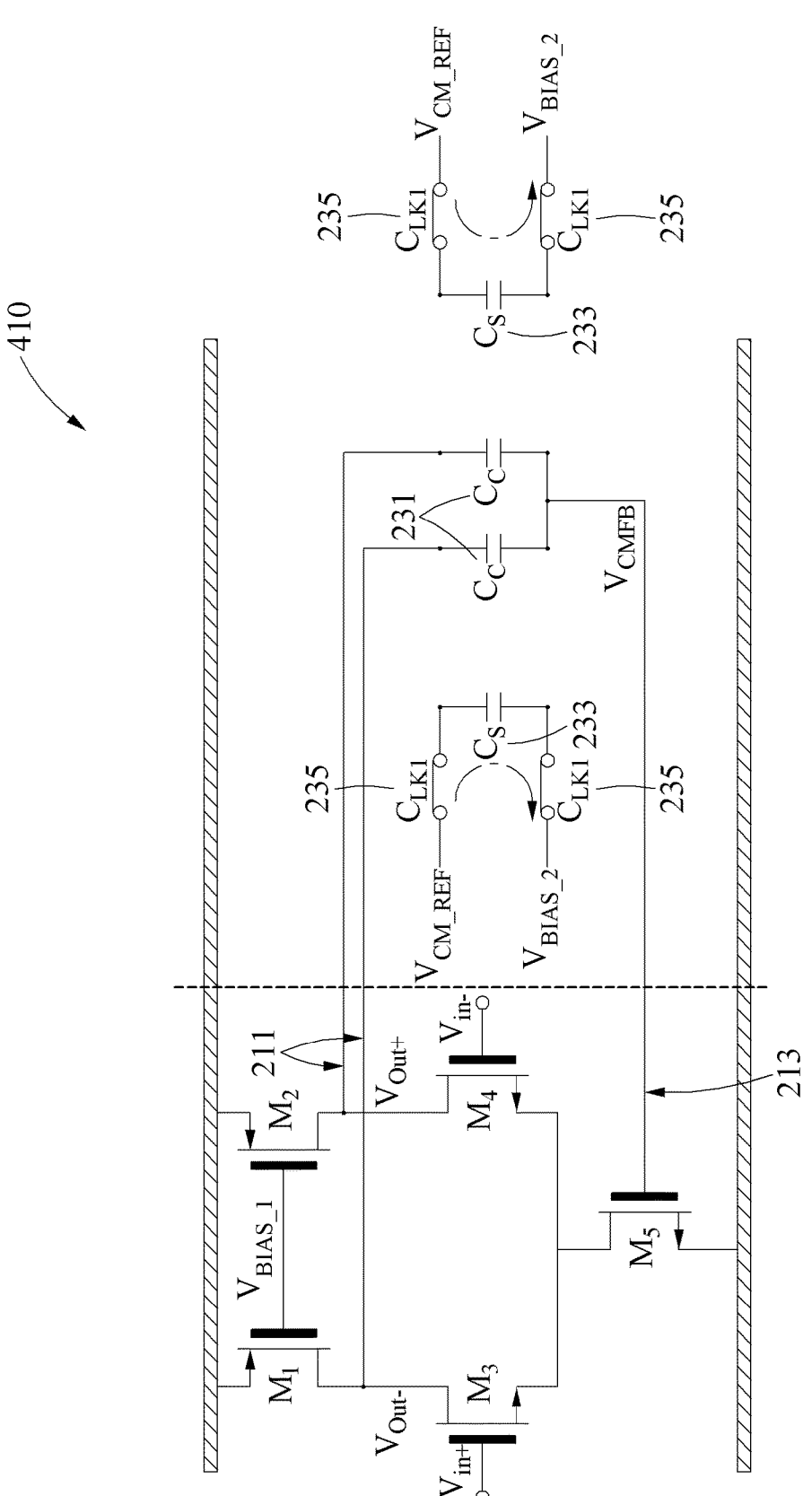
FIGS. 4A and 4B illustrate an example of an operation of switching elements when a clock signal of a first phase and a clock signal of a second phase are each applied to a continuous time op-amp, according to one or more embodiments.
Figure 4B:
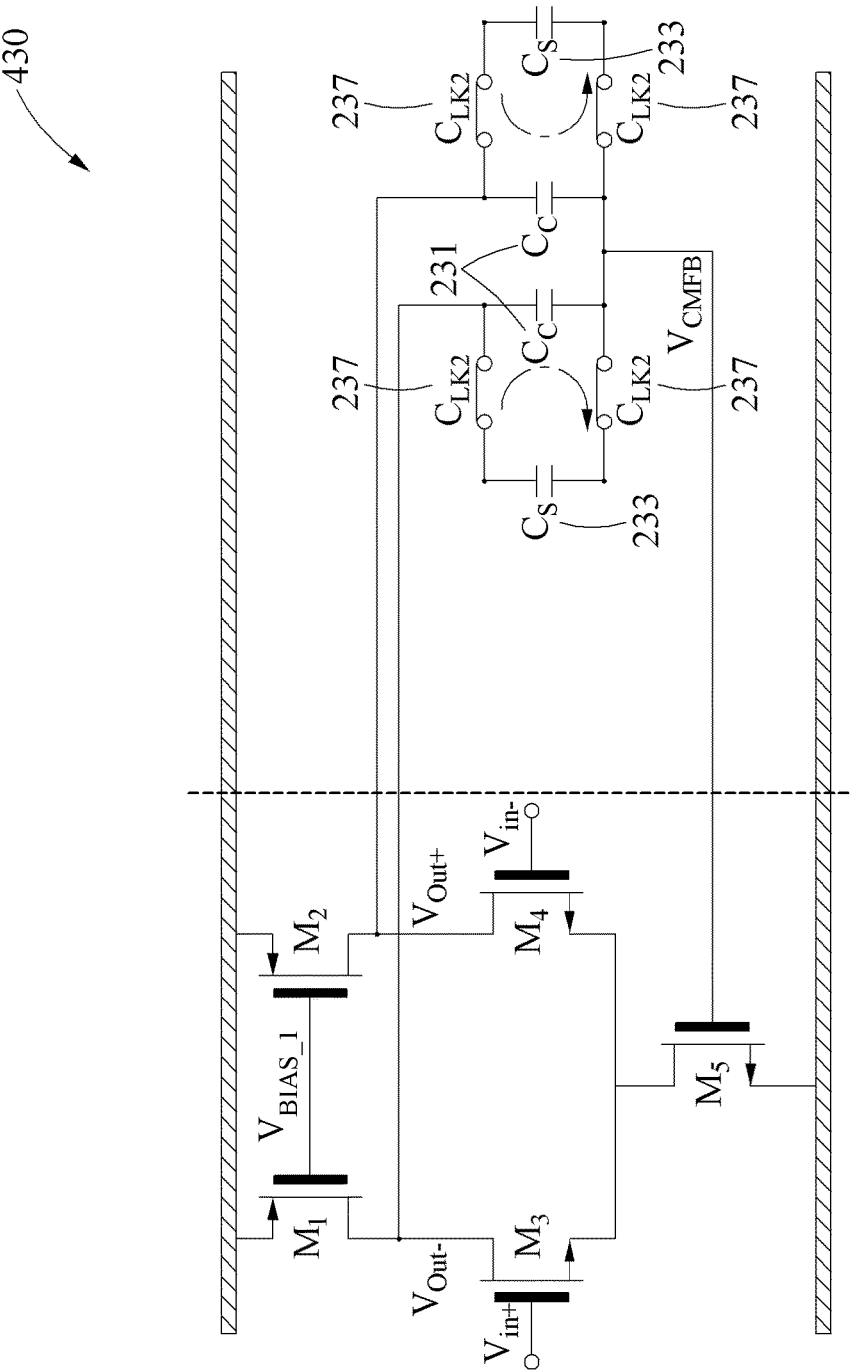

FIGS. 4A and 4B are diagrams illustrating an operation of first switching elements and second switching elements according to a clock signal of different phases applied to a CMFB circuit according to an example.

Referring to the example of FIG. 4A, a circuit connection relationship when the first switching elements 235 are turned on (according to an application of a clock signal of a first phase to a CMFB circuit) is indicated by reference number 410.

As the first switching elements 235 are turned on according to the clock signal $C_{LK1}$ of the first phase, one of the first switching elements 235 may connect the common mode reference voltage $V_{CM\_REF}$ with the switched capacitors $C_S$ 233 and another one of the first switching elements 235 may connect the bias voltage $V_{BIAS,2}$ with the switched capacitors $C_S$ 233. Since the second switching elements 237 are turned off, no connection occurs between the switched capacitors $C_S$ 233 and the feedback capacitors Cc 231. Accordingly, the switched capacitors $C_S$ 233 may be charged with the common mode reference voltage $V_{CM\_REF}$, more specifically, with a differential voltage between the common mode reference voltage $V_{CM\_REF}$ and the bias voltage $V_{BIAS,2}$ regardless of the feedback capacitors Cc 231.

A voltage corresponding to the output voltage $V_{BIAS,1}$ minus the common mode voltage $V_{CM}$ of the differential op-amp 210 may be provided to the feedback capacitors Cc 231 connected to the output lines 211 of the differential op-amp 210. A CMFB circuit may adjust a bias feedback voltage so that the common mode voltage $V_{CM}$ becomes close to the common mode reference voltage $V_{CM\_REF}$. That is, a CMFB circuit may update the common mode voltage $V_{CMFB}$, which is fed back, by comparing an electric charge of the feedback capacitors Cc 231 and a target electric charge of the common mode reference voltage $V_{CM\_REF}$. Electric charges charged in the feedback capacitors Cc 231 may be leaked due to the transistor (which is the bias current source $M_5$) which is connected with the feedback capacitors Cc 231 through the feedback line 213.

In the example of FIG. 4B, a circuit connection relationship when the second switching elements 237 are turned on by a clock signal of a second phase to a continuous time op-amp is indicated by reference number 430.

As the second switching elements 237 are turned on according to the clock signal $C_{LK2}$ of the second phase, a parallel connection between the switched capacitors $C_S$ 233 and the feedback capacitors Cc 231 is formed. A voltage (e.g., the common mode reference voltage $V_{CM\_REF}$ or a differential voltage between the common mode reference voltage $V_{CM\_REF}$ and the bias voltage $V_{BIAS,2}$) charged in the switched capacitors $C_S$ 233 by the first switching elements 235 is charged to the feedback capacitors Cc 231.

At this time, since the first switching elements 235 are turned off, the common mode reference voltage $V_{CM\_REF}$ and the bias voltage $V_{BIAS,2}$ have no impact on the feedback capacitors Cc 231, and a voltage charged in the switched capacitors $C_S$ 233 may be fully used to charge the feedback capacitors Cc 231.

Figure 5:
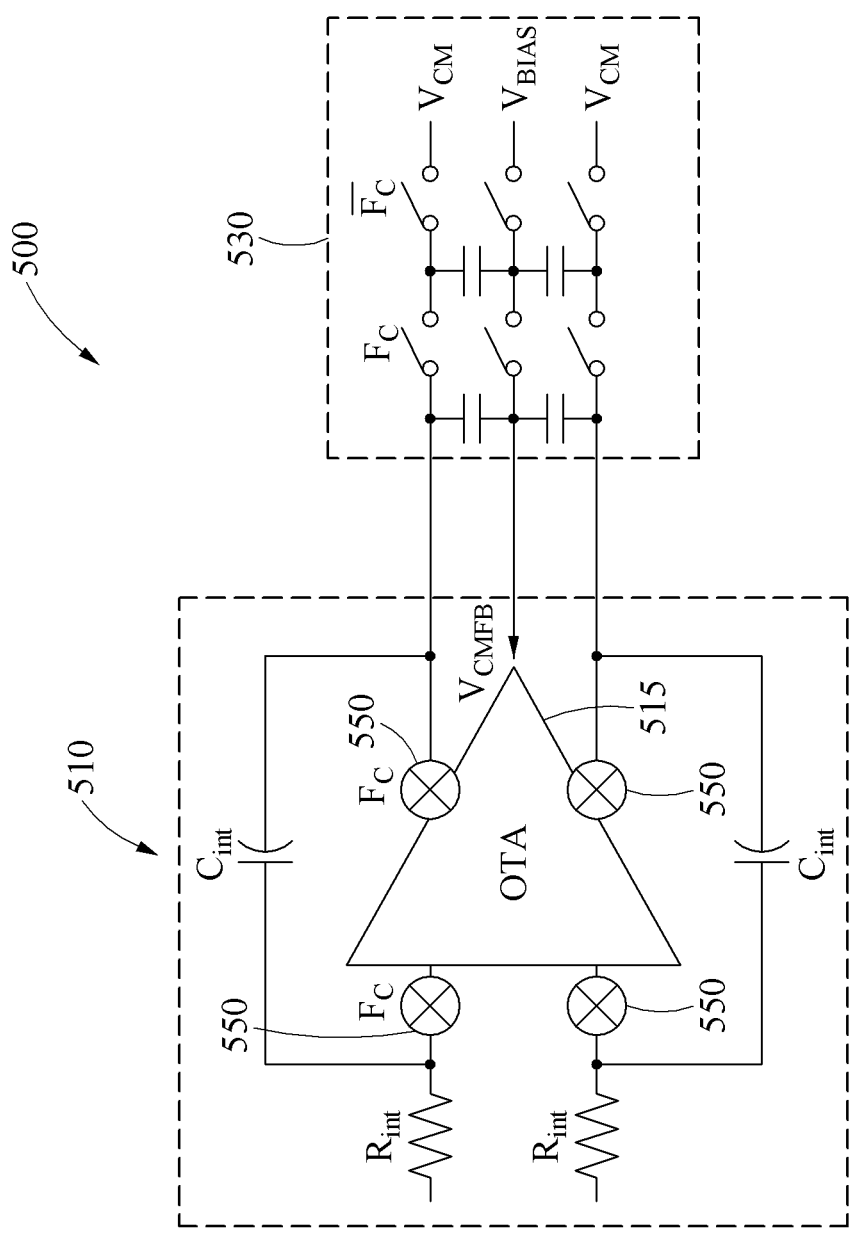
FIG. 5 illustrates an example of a circuit diagram of a continuous time op-amp operating based on a chopping frequency, according to one or more embodiments.

FIG. 5 illustrates an example of a circuit diagram of a continuous time op-amp 500 operating based on a chopping frequency. The continuous time op-amp 500 includes a differential op-amp 510 and a CMFB circuit 530.

The differential op-amp 510 may be, for example, a chopping amplifier using a chopping clock having a chopping frequency Fc 550 identical to a chopping clock used to reduce flicker noise of an amplifier. An operation of the chopping amplifier is described in detail with reference to FIG. 6 below.

Alternatively, the differential op-amp 510 may be, for example, an OTA 515 configured to produce current values amplified according to an application of mutually inverted input voltage values to input signals.

The CMFB circuit 530 may be implemented through a capacitive coupled path, which is periodically recharged by a switched capacitor without any additional amplifier except for the differential op-amp 510.

A chopping clock of the chopping frequency Fc 550 (identical to a clock used to reduce flicker noise of the differential op-amp 510) may be used as a clock of a first phase and a clock of a second phase of the CMFB circuit 530. As a result, the CMFB circuit 530 may be implemented in a continuous time delta sigma modulator without having to generate a separate clock.

In general, a continuous time CMFB circuit may sense a resistance reducing a gain of an amplifier and additionally use analog power due to an additional amplifier. In an example, the CMFB circuit 530 may maintain a gain of an amplifier by performing a capacitive sensing instead of a resistance sensing. In addition, more analog power may be saved by the CMFB circuit 530 not using an additional amplifier for feedback.

In an example, a capacitive coupling circuit, which is periodically recharged by using a switched capacitor, may be implemented in an output end of an op-amp (e.g., a differential op-amp), and a first phase clock and a second phase clock may provide a discrete time CMFB circuit, which is usable in a continuous time op-amp by using a chopping clock. Through structures described above, a discrete time CMFB circuit may, for example, be used in an audio continuous time delta-sigma modulator (DSM).

Figure 6:
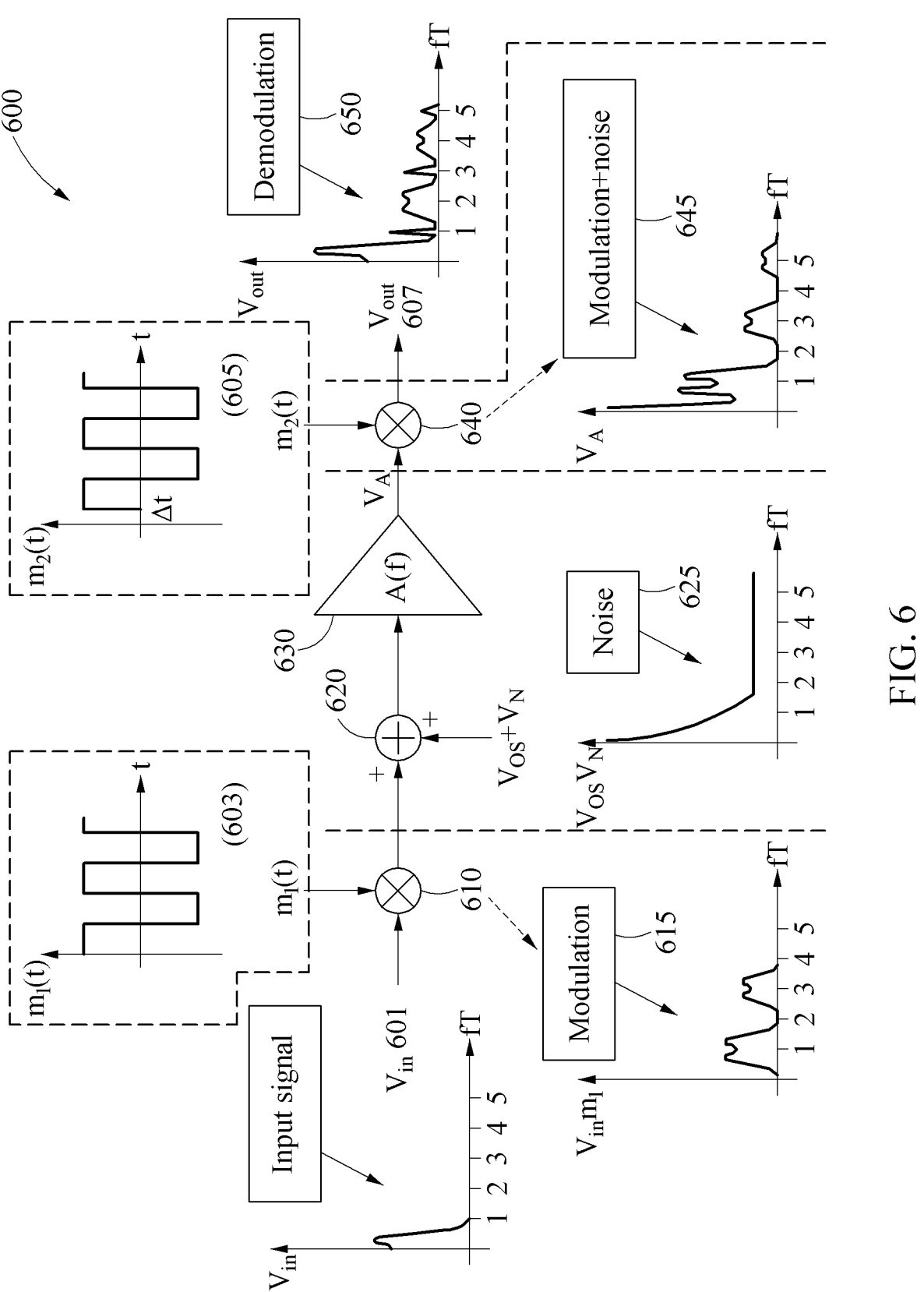
FIG. 6 illustrates an example of an operation of a chopping amplifier, according to one or more embodiments.

FIG. 6 illustrates an example of an operation of a chopping amplifier. Referring to FIG. 6, operation of a chopping amplifier (the differential op-amp 510 of FIG. 5) according to an example is indicated by reference number 600.

When an input signal $V_{in}$ 601 and a first clock signal $m_1(t)$ 603 are applied to a modulator 610 of a chopping amplifier, a modulation signal $V_{in} \times m_1(t)$ 615 may be generated.

The chopping amplifier may add (i) a noise component $V_N$ of an amplifier A(f) 630 and (ii) an offset component $V_{OS}$ 625 of the amplifier A(f) 630 to the modulation signal $V_{in} \times m_1(t)$ 615 as indicated by reference number 620 to input the result value to the amplifier A(f) 630.

The chopping amplifier may obtain a modulation result 645 (including noise), by performing a modulation again, which is done by applying an amplification result $V_A$ of the amplifier A(f) 630 and a second clock signal $m_2(t)$ 605 to a modulator 640.

The chopping amplifier may demodulate the modulation result 645 into a frequency identical to an initial input signal as in 650 and eliminate harmonic components through a low pass filter (LPF) to obtain a result $V_{out}$ 607 that is an amplification of an input signal. Here, a sine wave having a frequency identical to an input signal may be generated in the final result $V_{out}$ 607, and harmonic components included in input components may be eliminated through the LPF.

Figure 7:
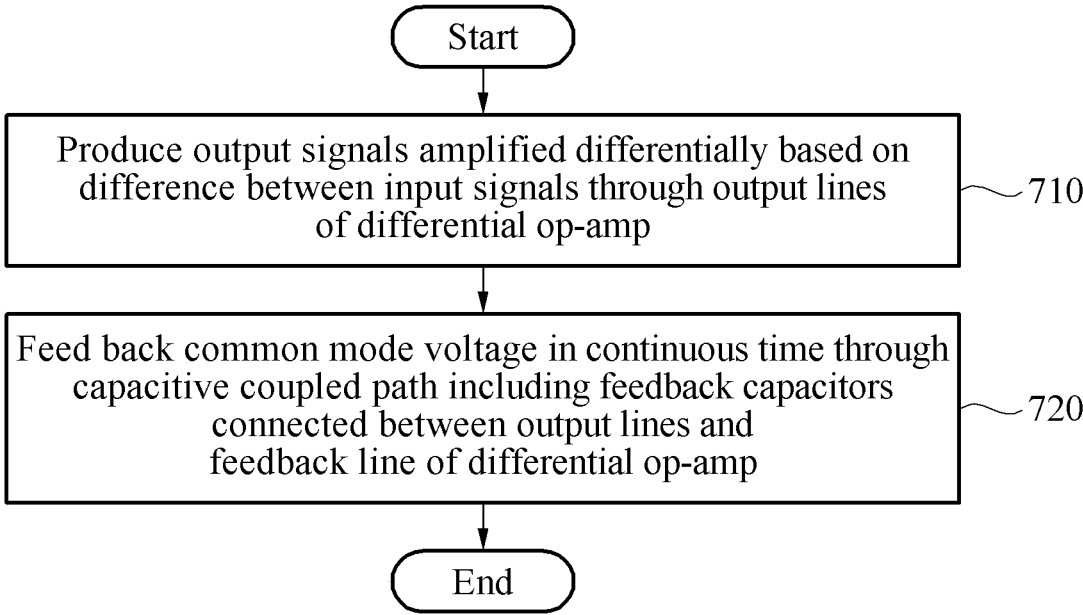
FIG. 7 illustrates an example of an operating method of a continuous time op-amp, according to one or more embodiments.

FIG. 7 illustrates an example of an operating method of a continuous time op-amp. In the following examples, operations may be performed sequentially, but not necessarily sequentially. The order of the operations may vary and at least two of the operations may be performed in parallel.

Referring to FIG. 7, a continuous time op-amp according to any examples described herein may feed back a common mode voltage in continuous time in operations 710 and 720.

In operation 710, the continuous time op-amp may produce, through output lines, output signals amplified differentially based on a difference between input signals.

In operation 720, the continuous time op-amp may feed back a common mode voltage in continuous time through a capacitive coupled path including feedback capacitors connected between output lines producing differentially-amplified output signals and including a feedback line of a differential op-amp. The continuous time op-amp may periodically recharge a charge leakage of the feedback capacitors occurring in the capacitive coupled path by switching elements and switched capacitors. Alternatively, the continuous time op-amp may compare a common mode voltage to a common mode reference voltage. Based on a result of the comparison, the continuous time op-amp may adjust a bias feedback voltage of a differential op-amp through a feedback line so that the common mode voltage becomes close to the common mode reference voltage.

A method by which a continuous time op-amp feeds back a common mode voltage is described in detail with reference to FIG. 8.

FIG. 8 illustrates an example of a method of feeding back a common mode voltage in continuous time. In the following examples, operations may be performed sequentially, but not necessarily sequentially. For example, the order of the operations may change and at least two of the operations may be performed in parallel.

Referring to FIG. 8, a continuous time op-amp according to an example may feed back a common mode voltage in operations 810 and 820.

In operation 810, the continuous time op-amp may charge switched capacitors with a common mode reference voltage by turning on first switching elements (which operate according to a clock signal of a first phase) among switching elements controlling a connection between feedback capacitors and the switched capacitors.

In operation 820, the continuous time op-amp may charge the feedback capacitors with the common mode reference voltage charged in the switched capacitors (in operation 810) by turning on second switching elements (among the switching elements), which operate mutually exclusively with the first switching elements according to a clock signal of a second phase opposite to a first phase.

The computing apparatuses, the electronic devices, the processors, the memories, the information output system and hardware, the storage devices, and other apparatuses, devices, units, modules, and components described herein with respect to FIGS. 1-8 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-8 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EE-PROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A continuous time op-amp comprising:
a differential op-amp configured to produce, and output through output lines, output signals amplified based on a difference between input signals inputted to the differential op-amp; and
a common mode feedback (CMFB) circuit configured to feed a common mode voltage back to the op-amp through a feedback line in continuous time through a capacitive coupled path,
wherein the CMFB circuit comprises:
feedback capacitors connected between the output lines and the feedback line;
switched capacitors charged based on a common mode reference voltage; and
switching elements configured to control a connection between the feedback capacitors and the switched capacitors, and
wherein the switching elements comprise:
first switching elements configured to operate according to a first phase of the clock signal; and
second switching elements configured to operate mutually exclusively with the first switching elements according to a second phase of the clock signal that is opposite in phase with respect to the first phase.

2. The continuous time op-amp of claim 1, wherein the CMFB circuit is configured to feed back the common mode voltage by periodically recharging, by the switching elements and the switched capacitors, a charge leakage of the feedback capacitors occurring in the capacitive coupled path.

3. The continuous time op-amp of claim 1, wherein the CMFB circuit comprises a negative feedback loop configured to adjust a bias feedback voltage of the differential op-amp through the feedback line based on a comparison result of the common mode voltage and the common mode reference voltage.

4. The continuous time op-amp of claim 1, wherein the switching elements are operated mutually exclusively, with respect to each other, based on a clock signal.

5. The continuous time op-amp of claim 1, wherein the first switching elements are configured to be turned on according to the first phase to charge the switched capacitors with the common mode reference voltage.

6. The continuous time op-amp of claim 1, wherein the second switching elements are configured to be turned on according to the second phase to charge the feedback capacitors with the common mode reference voltage charged in the switched capacitors.

7. The continuous time op-amp of claim 4, wherein the clock signal comprises a chopping clock.

8. The continuous time op-amp of claim 7, wherein the differential op-amp comprises a chopping amplifier configured to generate the chopping clock by modulating a direct current voltage input to the differential op-amp to an alternating voltage based on the clock signal.

9. The continuous time op-amp of claim 1, wherein the input signals comprise respective mutually inverted input voltages.

10. The continuous time op-amp of claim 1, further comprising a clock generator configured to generate a clock signal controlling opening and closing of the switching elements.

11. The continuous time op-amp of claim 1, wherein the differential op-amp comprises an operation transconductance amplifier (OTA) configured to produce amplified current values following an application of mutually inverted input voltage values to the input signals.

12. A method of operating a continuous time op-amp, the method comprising:
producing output signals amplified based on a difference between input signals inputted to the continuous time op-amp, wherein the output signals are outputted through output lines of the continuous time op-amp;
feeding a common mode voltage in continuous time back to the continuous time op-amp through a capacitive coupled path that includes feedback capacitors connected between the output lines and a feedback line of a differential op-amp, wherein a voltage corresponding to bias voltage minus the common mode voltage is provided to the feedback capacitors;
first and second switching elements configured to control a connection between the feedback capacitors and switched capacitors; and wherein
the feeding back of the common mode voltage comprises:
charging the switched capacitors with a common mode reference voltage by turning on the first switching elements with a first phase of a clock signal; and
charging the feedback capacitors with the common mode reference voltage charged in the switched capacitors by turning on the second switching elements with a second phase of the clock signal, wherein the second phase is opposite to the first phase.

13. The method of claim 12, wherein the feeding back of the common mode voltage further comprises periodically recharging a charge leakage of the feedback capacitors occurring in the capacitive coupled path by the first and second switching elements and the switched capacitors.

14. The method of claim 12, wherein the feeding back of the common mode voltage comprises:
adjusting a bias feedback voltage of the differential op-amp through the feedback line based on comparing of the common mode voltage to the common mode reference voltage, wherein the adjusting causes the common mode voltage to become closer to the common mode reference voltage.

15. The method of claim 12, wherein the input signals comprise a first input signal and a second input signal, wherein a first modulation signal is generated by modulating the first input signal.

16. The method of claim 15, wherein a noise component and an offset component are added to the first modulation signal.

17. The method of claim 16, wherein a modulation result is obtained by applying an amplification result and a second clock signal to a modulator.

* * * * *